United States Patent [19]

Learn et al.

[11] Patent Number: 4,582,020

[45] Date of Patent: Apr. 15, 1986

[54] CHEMICAL VAPOR DEPOSITION WAFER BOAT

[75] Inventors: Arthur J. Learn, Cupertino; Dale R. DuBois, Los Gatos, both of Calif.

[73] Assignee: Anicon, Inc., San Jose, Calif.

[21] Appl. No.: 607,065

[22] Filed: May 4, 1984

[51] Int. Cl.⁴ .................. C23C 16/44; B05C 13/02
[52] U.S. Cl. .................. 118/728; 118/500; 118/732
[58] Field of Search ............ 118/500, 728, 715, 732, 118/725, 729, 730; 432/253

[56] References Cited

U.S. PATENT DOCUMENTS

| | | | |
|---|---|---|---|
| 4,098,923 | 7/1978 | Alberti et al. | 118/728 |
| 4,179,326 | 12/1979 | Kudo et al. | 156/612 |
| 4,466,381 | 8/1984 | Jenkins | 118/728 |

FOREIGN PATENT DOCUMENTS 2746427 4/1979 Fed. Rep. of Germany.

Primary Examiner—Bernard F. Plantz
Attorney, Agent, or Firm—William B. Walker

[57] ABSTRACT

A chemical vapor deposition wafer boat for supporting a plurality of wafers in an evenly spaced, upright orientation perpendicular to the axis of the boat comprises a cylinder having closed ends and comprised of mutually engaging upper and lower hemicylinders. The upper hemicylinder has diffusion zones with gas flow passageways therein in the ends and zones within from 0 to 75 and within from 0 to 15 degrees from a vertical plane through the cylinder axis. The remainder of the hemicylinder wall and the ends are baffle areas without gas flow passageways. The ends and sidewall of the lower hemicylinder comprise gas diffusion zones. The gas flow passageways comprise from 0.5 to 80 percent of the surface area of the respective gas diffusion zones.

12 Claims, 7 Drawing Figures

U.S. Patent   Apr. 15, 1986   Sheet 1 of 3   4,582,020
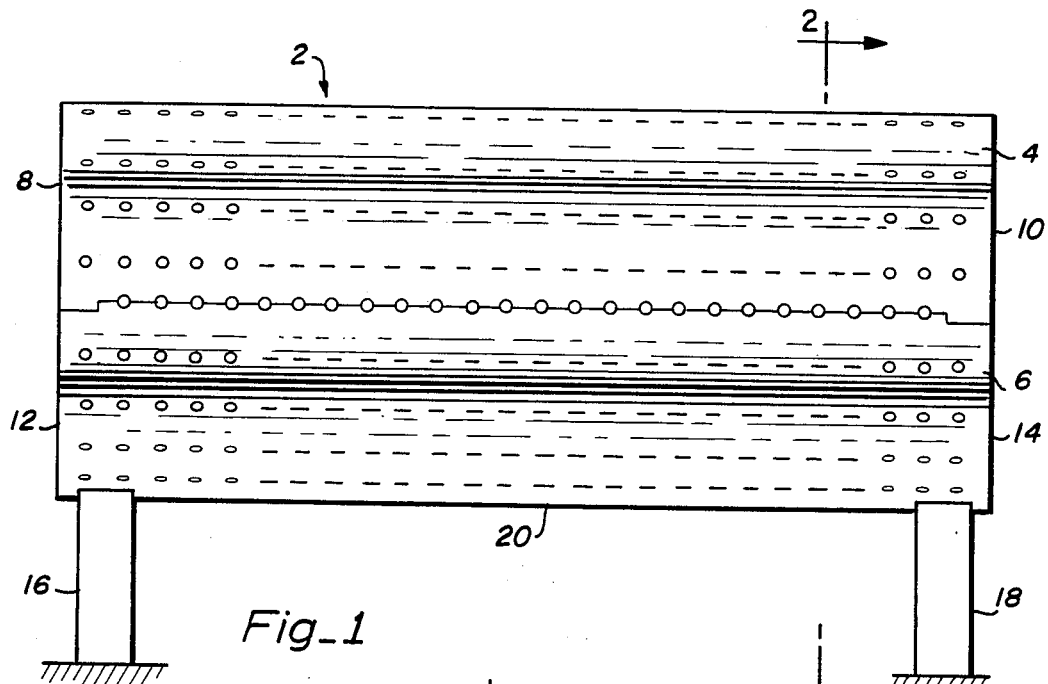
Fig_1
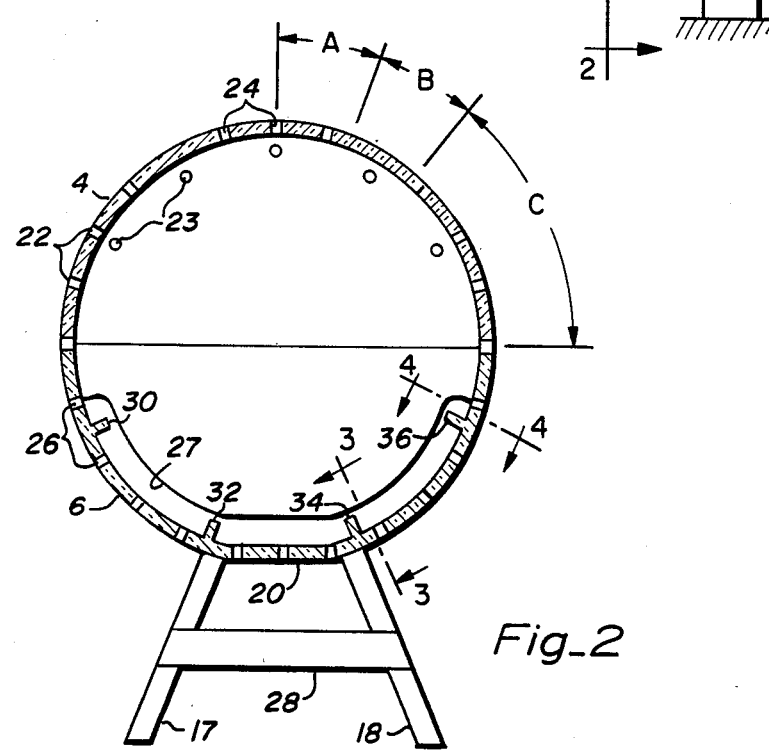
Fig_2
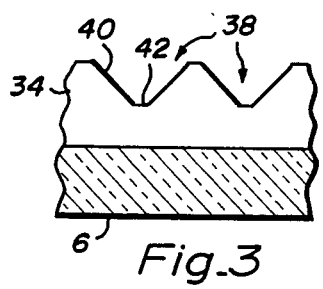
Fig_3
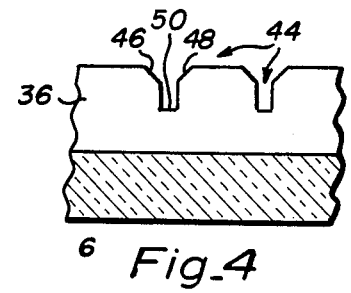
Fig_4

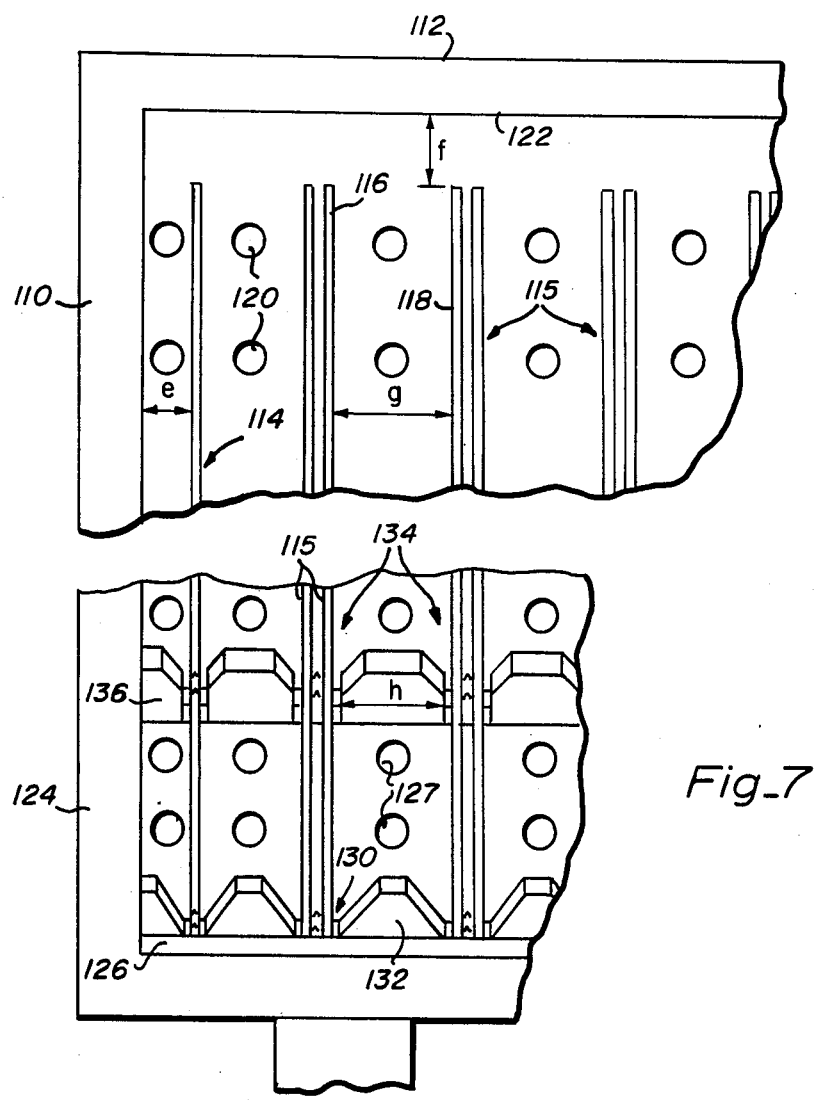
Fig_7

CHEMICAL VAPOR DEPOSITION WAFER BOAT

FIELD OF THE INVENTION

This invention relates to a chemical vapor deposition wafer boat. In particular, this invention relates to a wafer boat for use with chemical vapor deposition processes in vertical devices to produce highly uniform, uncontaminated coatings of silicon dioxide and other materials on substrates.

BACKGROUND OF THE INVENTION

Chemical vapor deposition (CVD) is the process of depositing a solid material from a gaseous phase onto a substrate by means of a chemical reaction. This deposition reaction is generally thermal decomposition, chemical oxidation, or chemical reduction. In one example of thermal decomposition, organometallic compounds are transported to the substrate surface as a vapor and are reduced to the elemental metal state on the substrate surface. For chemical reduction, the reducing agent most usually employed is hydrogen, although metal vapors can also be used. The substrate can also act as a reductant as in the case of tungsten hexafluoride reduction by silicon. The substrate can also supply one element of a compound or alloy deposit. The CVD process can be used to deposit many elements and alloys as well as compounds including oxides, nitrides and carbides.

In the present invention, CVD technology is used to manufacture highly uniform silicon dioxide deposits on semiconductor wafer substrates.

Chemical vapor deposition of electronic materials is described by T. L. Chu et al, *J. Vac.Sci. Technol.* 10:1 (1973) and B. E. Watts, *Thin Solid Films.* 18:1 (1973). They describe the formation and doping of epitaxial films of such materials as silicon, germanium and GaAs, for example. A summary of the chemical vapor deposition field is provided by W. A. Bryant, "The Fundamentals of Chemical Vapour Deposition", *Journal of Materials Science.* 12:1285 (1977). Low pressure CVD production of silicon dioxide deposits is summarized by R. Rosler, *Solid State Technology.* 63-70 (April 1977), the contents thereof being incorporated by reference.

DESCRIPTION OF THE PRIOR ART

The positioning of a plurality of wafers in a row in a vapor deposition device has been previously described in U.S. Pat. No. 3,471,326, for example, and placing them in a vertical orientation has been described in U.S. Pat. Nos. 3,922,467 and 4,018,183. Open wafer support boats which can be preloaded before insertion into tube furnaces are described in U.S. Pat. Nos. 4,220,116 and 4,355,974, and similar boats combined with shrouds of parallel rod gas flow turbulence producers are described in U.S. Pat. Nos. 4,203,387 and 4,309,240.

A boat comprising a perforated hemicylindrical upper section and a lower hemicylindrical lower section of axially parallel rods is disclosed in U.S. Pat. No. 4,256,053. Boats comprising perforated cylindrical cylinders with end closures are described in U.S. Pat. Nos. 4,098,923 and 4,232,063. These boats are designed to be preloaded and placed in conventional tube furnaces, creating non-laminar mixing turbulence in the gas flowing into the wafer section. Because of the nature of the gas flow patterns with these devices, it is necessary for all surfaces to be uniformly open for gas inflow, exposing the wafer surfaces to unavoidable jets or streams of reactive gas and particulate contamination. In vertical reactors such as those described in commonly assigned, copending application Ser. No. 528,193 filed Aug. 31, 1983 now U.S. Pat. No. 4,539,933, these prior art boats are unsuitable for providing uniform films of silicon dioxide and other materials, both because of their inability to provide the requisite gas diffusion flow and for their failure to exclude particulates from the wafer surface.

SUMMARY OF THE INVENTION

The chemical vapor deposition wafer boats of this invention are means for supporting a plurality of wafers in an evenly spaced, upright orientation perpendicular to the axis of the boat. The boat comprises a cylinder having closed ends and having mutually engaging upper and lower hemicylinders, the upper hemicylinder having diffusion zones with gas flow passageways therein in the ends and in zones within from 0 to 75 degrees from a horizontal plane through the cylinder axis and from 0 to 15 degrees from a vertical plane through the cylinder axis. The remainder of the hemicylinder wall constitutes baffle areas without gas flow passageways. The ends and sidewall of the lower hemicylinder constitute gas diffusion zones. The gas flow passageways comprising from 0.5 to 80 percent of the surface area of the respective gas diffusion zones.

BRIEF DESCRIPTION OF THE DRAWINGS

FIG. 1 is a side view of the cylindrical wafer boat of this invention.

FIG. 2 is a cross-sectional view of the cylindrical wafer boat of this invention taken along the line 2—2 in FIG. 1 with wafers omitted.

FIG. 3 is a fragmentary cross-sectional view of the lower wafer support rails taken along line 3—3 in FIG. 2.

FIG. 4 is a fragmentary cross-sectional view of the upper wafer support rails taken along line 4—4 in FIG. 2.

FIG. 7 is a fragmentary cross-sectional view of a wafer boat with wafers loaded in the back-to-back position according to this invention.

DETAILED DESCRIPTION OF THE INVENTION

Figure 5:
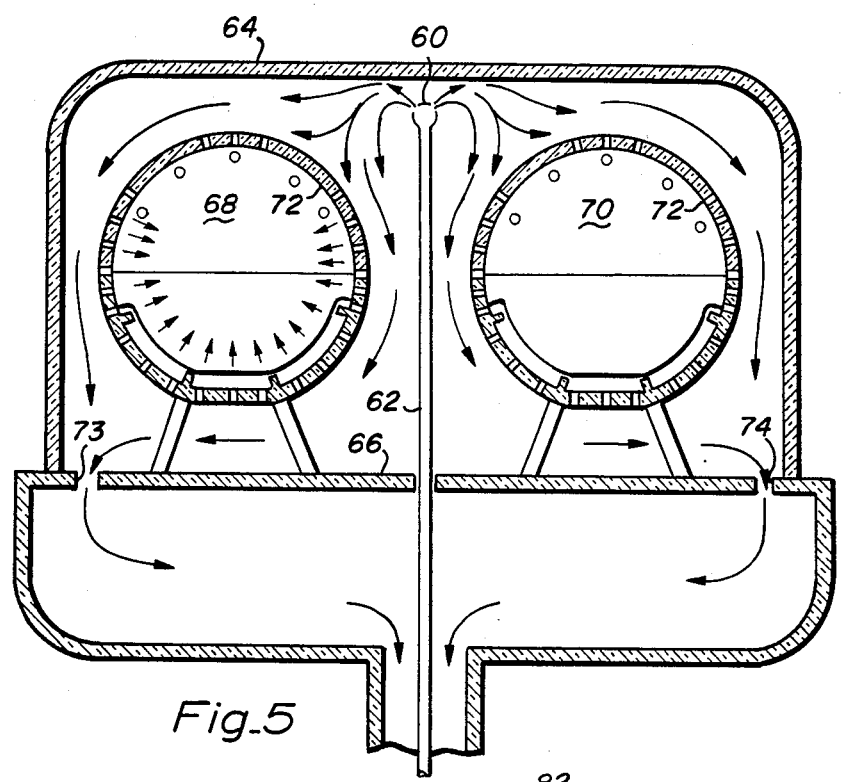
FIG. 5 is a cross-sectional representational view of the reaction chamber of the vertical CVD device showing the gas flow patterns around and in the wafer boats.

FIG. 1 is a side view of the cylindrical wafer boat of this invention, and FIG. 2 is a cross-sectional view taken along the line 2—2 in FIG. 1. The central axis of the cylindrical wafer boat 2 is horizontal, and wafers supported therein for coating are supported in an upright orientation. The term "upright", as used herein, denotes that the wafers are supported on their edges, and the planes of the wafer surfaces are substantially vertical, that is, within 10° of vertical. The optimum orientation is a uniform slight tilt from the vertical of less than 5°.

The inner surfaces of the cylindrical walls have the shape of and conform to the outer edges of the individual wafers to be coated, being precisely spaced from the edges of the wafers. The cylindrical wafer boat 2 comprises an upper hemicylindrical section 4 and a lower hemicylindrical section 6 having mutually engaging opposed surfaces which join in a horizontal plane approximately through the central axis of the cylinder 2. The ends 8 and 10 of the upper hemicylinder and 12 and 14 of the lower hemicylinder are closed with gas flow passageways therein. Leg projections 16 and 18 project from the lower surface of hemicylinder 6 and are preferably integral therewith. The lower surface 20 of the hemicylinder 6 can be a flat section to engage the flat lower indexing edge typically present on a wafer, if desired. The leg projections 16 and 18 maintain the wafer boat in a stable orientation, precisely positioned in the reaction zone with the lower surface thereof at least 0.1 inches and preferably at least 0.3 inches above the supporting surface.

Referring to FIG. 2, lower gas flow passageways 22 and upper gas flow passageways 24 are present in the sidewall portions of the upper hemicylinder which constitute the diffusion zones thereof. The ends 8 and 10 are also diffusion zones, gas flow passageways 23 being positioned in the end walls 8 and 10. The lower passageways 22 are within the diffusion Zones C corresponding to Angle C in FIG. 2. Zones B corresponding to Angle B is closed and free of passageways. Angle C is from 10° to 75° and preferably from 10° to 60° of the horizontal plane dividing the cylinder into upper and lower hemicylinders. Additional openings 24 can be provided in the upper hemicylinder within Zone A corresponding to Angle A. Angle A is within 15° and preferably within 10° of the vertical plane through the axis of the cylinder 2. Passageways 22 and 24 can be circular holes, as shown, or have oval, elliptical, rectangular, slotted or other cross-sectional shapes, if desired. In one embodiment, the passageways 22 are positioned throughout the diffusion Zone C in a substantially even distribution. The cross-sectional area of the gas flow passageways can be from 0.5 to 80 percent, preferably from 0.5 to 40, and optimally from 0.5 to 20 percent of the total outer surface area of Zone C (including the portions occupied by holes). The upper and lower hemicylinders are preferably symmetrical about the vertical axis, and the Zones B and C are present on both sides of the vertical axis of the upper hemicylinder 4 in a symmetrical configuration.

The entire lower hemicylinder wall 6 is a gas diffusion zone and preferably has gas flow passageways 26. These are preferably uniformly distributed and can have the shapes described above with respect to the passageways in the upper hemicylinder 4. The cross-sectional area of the gas flow passageways 26 can be from 0.5 to 80 percent, preferably from 0.5 to 40, and optimally from 0.5 to 20 percent of the total outer surface area of the lower hemicylinder 6 (including the portions occupied by holes). The ends 12 and 14 also have gas flow passageways arranged to permit gas flow into the ends of the cylinder 2. In end closure 14, for example, the passageway 27 is an open slot having an arcuate shape adjacent the wall 6 conforming to the shape of the sidewall 6 and bottom wall 20. The passageways 27 in the ends 12 and 14 preferably occupy less than 20 percent of the end closure area.

The legs 16, 17 and 18 are supported by a cross-beam 28 preferably integral therewith. The legs 16, 17 and 18 are designed to support the cylindrical wafer boat 2 in a stable orientation during the coating operation. They are also designed to straddle and engage a loading fork projection (not shown) of a loading apparatus, by which means the boats can be automatically and rapidly loaded and unloaded from the wafer support surface. Such a loading apparatus is described in commonly assigned, copending application Ser. No. 529,415 filed Sept. 6, 1983 now U.S. Pat. No. 4,524,719.

The rails 30, 32, 34 and 36 maintain the wafers placed in the boat in a precisely spaced, upright position.

FIG. 3 is a fragmentary cross-sectional view of the wafer boat taken along line 3—3 in FIG. 2 showing details of the lower wafer support rails. The slots 38 in rail 34 have angularly sloped sides 40 tapering to merge with the bottom surfaces 42, maintaining the bottom of the wafers placed therein in a precisely determined spacing but leaving the wafer surface fully exposed.

FIG. 4 is a fragmentary cross-sectional view of the wafer boat taken along line 4—4 in FIG. 2 showing details of the upper wafer support rails. The slots 44 in rail 36 support the wafers placed therein in the vertical orientation. They have tapered portions 46 and 48 which facilitate loading and reduce the portion of the wafer surface masked by the slots when the wafers are bottomed against the slot surface 50.

FIG. 5 is a cross-sectional representational view of the reaction chamber of the vertical CVD device showing the gas flow patterns around and in the wafer boats with the wafers omitted for a clearer representation. The gas exits from the outlet 60 of the gas distributor 62 into the reaction chamber defined by the cover 64 and the support plate 66. Gas flows through the reaction chamber around the wafer boats 68 and 70, exiting through gas outlet openings 73 and 74 in the support plate 66. The support plate together with the lower bowl shaped element 76 define a gas removal system under reduced pressure. The gas flows continuously during the coating operation from the outlet 60 through the reaction chamber and out through the gas removal system.

The wafer surfaces are protected by the boat configuration from direct impingement by turbulent gas flows, or jets or streams of gas flowing in paths. Gas flow into the boat interior is by diffusion. Zone B represented by 72 does not have passageways and provides a baffle surface which shields the wafers from the turbulence surrounding the gas outlet 60, eliminating a major source of the commonplace surface irregularities characteristic of the previously known devices. The gas diffuses into the boat interior through the passageways 22, 23, 24, 26 and 27 (FIG. 2).

In the preferred embodiments of this invention, wafer spacing, the gap between wafers and the passageway walls, the percentage open area represented by the gas flow passageways, and boat surface roughness are controlled to provide optimum conditions which yield improved wafer-to-wafer and wafer edge-to-center coating uniformity.

Figure 6:
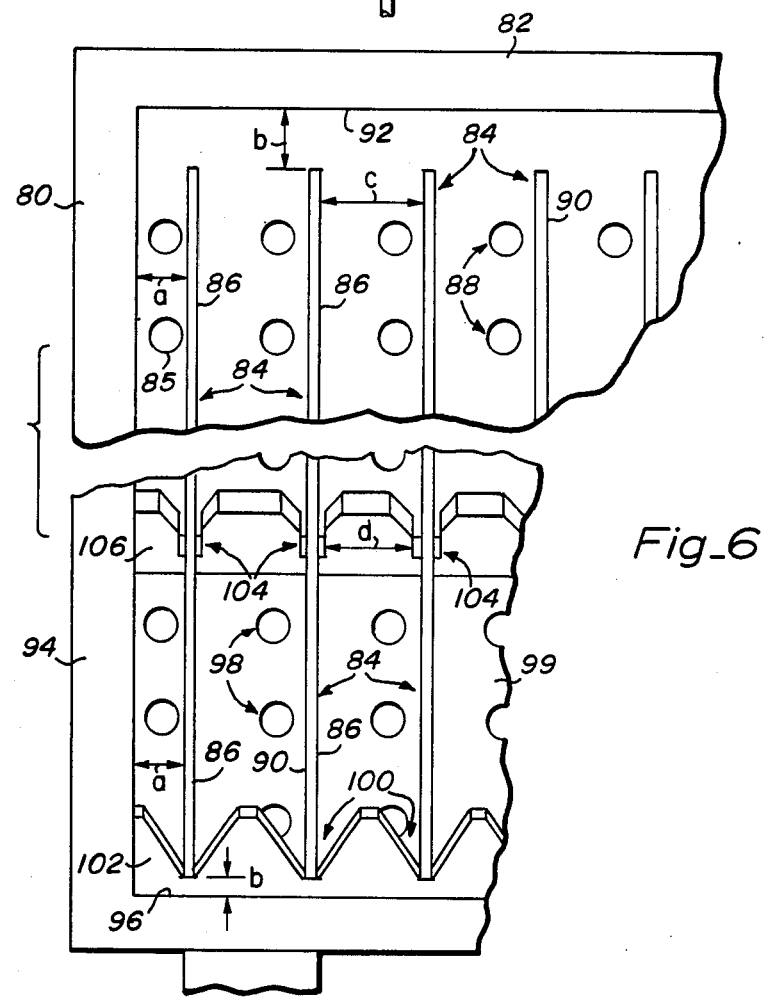
FIG. 6 is a fragmentary cross-sectional view of a wafer boat with wafers loaded in the front-to-back position according to this invention.

FIG. 6 is a fragmentary cross-sectional view of a wafer boat with wafers loaded in the front-to-back position according to this invention. The end 80 is precisely spaced from the wafers 84 at a distance "a" which is at least 2 mm. and preferably is from 2 to 4 mm, sufficient to permit gas flow passageways 85 between the end wafer and the hemicylinder end 80. The front surfaces 86 are the coating surfaces and are facing to the right in this embodiment. The inlet passageways 88 are adjacent the back surfaces 90 of the wafers 84. The distance "b" between the outer edges of the wafers 84 and the inner surface 92 of the hemicylinder 82 can be from 1.0 to 5.0 mm.

The end 94 of the lower hemicylinder and the inner surface 96 thereof are correspondingly spaced (dimensions "a" and "b") from the outer edges of the wafers 84. The gas inlet passageways 98 in the lower hemicylinder wall 99 are spaced adjacent the back surfaces 90 of the wafers and at a maximum distance from the front wafer surfaces 86. The wafers 84 rest in slots 100 in rails 102 on the bottom of the lower hemicylinder, and are maintained in a predetermined wafer-to-wafer spacing by slots 104 in the siderails 106. The wafer-to-wafer spacing "c" corresponds to the distance "d" between slots 104 and can be from 2.5 to 12.5 mm.

FIG. 7 is a fragmentary cross-sectional view of a wafer boat with wafers loaded in the back-to-back position according to this invention. The end 110 is precisely spaced from the end wafer 114 at a distance "e" which is at least 2 mm. and is preferably from 2 to 4 mm. The front wafer coating surfaces 116 and 118 of the wafers 115 are opposed (back-to-back) in this embodiment. The inlet passageways 120 are maximally spaced from the coating surfaces 116 and 118 of the wafers 115. The distance "f" between the outer edges of the wafers 115 and the inner surface 122 of the hemicylinder 112 can be from 1.0 to 5.0 mm.

The end 124 of the lower hemicylinder and the inner surface 126 thereof are also spaced from the outer edges of the wafers 115 by the distances "e" and "f" described in conjunction with the upper hemicylinder. The gas inlet passageways 127 in the hemicylinder wall are spaced at a maximum distance from the coating surfaces 116 and 118 of the wafers 115. The wafers 115 rest in slots 130 in rails 132 on the bottom of the lower hemicylinder, and are maintained in a predetermined wafer-to-wafer spacing by slots 134 in the siderails 136. The wafer-to-wafer spacing "g" corresponds closely to the distance "h" between slots 134 and can be from 2.5 to 12.5 mm.

The boat surface is preferably roughened and has a roughness corresponding to a surface area ratio of roughened boat surface area to the corresponding smooth boat surface area of from 1 to 4.

Preferred and optimum dimensions for wafer boats to be used in vertical CVD devices having gas flow patterns such as are shown in FIG. 5 are shown in Table A.

TABLE A

|  | Preferred Ranges | | Optimum Range |
| --- | --- | --- | --- |
| Wafer spacing, mm. | 5–8 | 8–11 | 9–10 |
| Roughness$^m$ | 1.0–3.0 | 1.0–3.0 | 1.5–2.5 |
| Gap, wafer edge to Boat surface, mm. | 2.0–3.0 | 2.0–3.0 | 2.0–3.0 |
| Passageway area$^n$ | 0.5–2.5 | 1.0–6.0 | 2.0–4.0 |

$^m$ratio of roughened boat surface area to smooth boat surface area
$^n$percentage of wall surface occupied by gas flow passageways As can be seen from Table A, if wafer spacing is reduced to increase wafer throughput, the area of the gas flow passageway is also reduced for optimum uniformity. The back-to-back loading configuration shown in FIG. 7 provides a maximum spacing for a corresponding load of wafers, and is the preferred arrangement for maximum loading at optimum coating conditions.

The controlled gas diffusion effects edge to center and wafer to wafer coating variations of less than 2 percent and under most carefully controlled optimum conditions of less than one percent, making the process particularly suitable for manufacturing VLSI devices. The wafer boats of this invention are particularly suitable for use in the vertical CVD apparatus described in commonly assigned, copending application Ser. No. 528,193 filed Aug. 31, 1983 now U.S. Pat. No. 4,539,933, the entire contents of which are hereby incorporated by reference.

The invention claimed is:

1. A chemical vapor deposition wafer boat means for supporting a plurality of wafers in an evenly spaced, upright orientation perpendicular to the axis of the boat, the boat comprising a cylinder having closed ends and comprised of mutually engaging upper and lower hemicylinders, the upper hemicylinder having diffusion zones with gas flow passageways therein in the ends and in zones within from 0° to 75° from a horizontal plane through the cylindrical axis and from 0° to 15° from a vertical plane through the cylinder axis, the remainder of the hemicylinder wall being baffle areas without gas flow passageways, the ends and sidewall of the lower hemicylinder comprising gas diffusion zones with gas flow passageways therein, the gas flow passageways comprising from 0.5 to 80 percent of the surface area of the respective gas diffusion zones, wherein the boat surface is roughened, and the surface area ratio of the roughened boat surface to the corresponding smooth boat surface is within the range of from 1 to 4.

2. The chemical vapor deposition wafer boat means of claim 1 wherein the surface area ratio of roughened surface to corresponding smooth surface is within the range of from 1.5 to 2.5.

3. The chemical vapor deposition wafer boat means of claim 1 wherein the distance between adjacent slots is within the range of from 2.5 to 12.5 mm., the gap between wafer edge and inner hemicylinder is selected to be within the range of from 1.0 to 5.0 mm., and the gas flow passageways are from 0.5 to 10 percent of the diffusion zone surface area.

4. The chemical vapor deposition wafer boat means of claim 3 wherein the distance between adjacent slots is within the range of from 5 to 8 mm., the roughened surface area ratio is with the range of from 1.0 to 3.0 the gap between the wafer edge and inner hemicylinder surface is selected to be within the range of from 2.0 to 3.0, mm., and the gas flow passageways are from 0.5 to 2.5 percent of the diffusion zone surface area.

5. The chemical vapor deposition wafer boat means of claim 3 wherein the distance between adjacent slots is within the range of from 8 to 11 mm., the roughened surface area ratio is with the range of from 1.0 to 3.0, the gap between the wafer edge and inner hemicylinder surface is selected to be within the range of from 2.0 to 3.0 mm., and the gas flow passageways are from 1.0 to 6.0 percent of the diffusion zone surface area.

6. The chemical vapor deposition wafer boat means of claim 3 wherein the distance between adjacent slots is within the range of from 9 to 10 mm., the roughened surface area ratio is with the range of from 1.5 to 2.5, the gap between the wafer edge and inner hemicylinder surface is selected to be within the range of from 2.0 to 3.0 mm., and the gas flow passageways are from 2.0 to 4.0 percent of the diffusion zone surface area.

7. A chemical vapor deposition apparatus comprising a vapor deposition chamber having a gas inlet means positioned in the upper portion of the chamber for introducing gases into the chamber and a gas outlet means positioned in the lower portion of the chamber for removing gases from the chamber, a cylindrical wafer boat means positioned between the gas inlet means and the gas outlet means for supporting a plurality of wafers in an evenly spaced, upright orientation, the boat means comprising a cylinder having closed ends and comprised of mutually engaging upper and lower hemicylinders, the upper hemicylinder having diffusion zones with gas flow passageways therein in the ends and in zones within from 0° to 75° from a horizontal plane through the cylindrical axis and from 0° to 15° from a vertical plane through the cylinder axis, the remainder of the hemicylinder wall being baffle area without gas flow passageways positioned between the gas inlet means and interior of the boat means, the ends and sidewall of the lower hemicylinder comprising gas diffusion zones with gas flow passageways therein, the gas flow passageways comprising from 0.5 to 80 percent of the surface area of the respective gas diffusion zones, wherein the surface of the boat means is a roughened boat surface, and the surface area ratio of the roughened boat surface to the corresponding smooth boat surface is within the range of from 1 to 4.

8. The chemical vapor deposition apparatus of claim 7 wherein the surface area ratio of roughened boat surface to corresponding smooth boat surface is within the range of from 1.5 to 2.5.

9. A chemical vapor deposition apparatus comprising a vapor deposition chamber having a gas inlet means positioned in the upper portion of the chamber for introducing gases into the chamber and a gas outlet means positioned in the lower portion of the chamber for removing gases from the chamber, a cylindrical wafer boat means positioned between the gas inlet means and the gas outlet means for supporting a plurality of wafers in an evenly spaced, upright orientation, the boat means comprising a cylinder having closed ends and comprised of mutually engaging upper and lower hemicylinders, the upper hemicylinder having diffusion zones with gas flow passageways therein in the ends and in zones within from 0° to 75° from a horizontal plane through the cylindrical axis and from 0° to 15° from a vertical plane through the cylinder axis, the remainder of the hemicylinder wall being baffle area without gas flow passageways positioned between the gas inlet means and interior of the boat means, the ends and sidewall of the lower hemicylinder comprising gas diffusion zones with gas flow passageways therein, the gas flow passageways comprising from 0.5 to 80 percent of the surface area of the respective gas diffusion zones, wherein in the wafer boat means, the distance between adjacent slots is within the range of from 2.5 to 12.5 mm., the boat surface is roughened, and the surface area ratio of the roughened boat surface to the corresponding smooth boat surface is within the range of from 1 to 4, the gap between wafer edge and inner hemicylinder is selected to be within the range of from 1.0 to 5.0 mm., and the gas flow passageways are from 0.5 to 10 percent of the diffusion zone surface area.

10. The chemical vapor deposition apparatus of claim 9 wherein in the wafer boat means, the distance between adjacent slots in within the range of from 5 to 8 mm., the roughened surface area ratio is with the range of from 1.0 to 3.0, the gap between the wafer edge and inner hemicylinder surface is selected to be within the range of from 2.0 to 3.0 mm., and the gas flow passageways are from 0.5 to 2.5 percent of the diffusion zone surface area.

11. The chemical vapor deposition apparatus of claim 9 wherein in the wafer boat means, the distance between adjacent slots is within the range of from 8 to 11 mm., the roughened surface area ratio is with the range of from 1.0 to 3.0, the gap between the wafer edge and inner hemicylinder surface is selected to be within the range of from 2.0 to 3.0 mm., and the gas flow passageways are from 1.0 to 6.0 percent of the diffusion zone surface area.

12. The chemical vapor deposition apparatus of claim 9 wherein in the wafer boat means, the distance between adjacent slots is within the range of from 9 to 10 mm., the roughened surface area ratio is with the range of from 1.5 to 2.5, the gap between the wafer edge and inner hemicylinder surface is selected to be within the range of from 2.0 to 3.0 mm., and the gas flow passageways are from 2.0 to 4.0 percent of the diffusion zone surface area.

* * * * *